United States Patent
Rao

(10) Patent No.: US 8,264,895 B2
(45) Date of Patent: Sep. 11, 2012

(54) RESISTANCE BASED MEMORY CIRCUIT WITH DIGITAL SENSING

(75) Inventor: Hari Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 325 days.

(21) Appl. No.: 12/627,239

(22) Filed: Nov. 30, 2009

(65) Prior Publication Data

US 2011/0128771 A1 Jun. 2, 2011

(51) Int. Cl.
*G11C 7/00* (2006.01)
(52) U.S. Cl. .............. 365/196; 365/210.14; 365/189.09; 365/189.07; 365/148; 365/236
(58) Field of Classification Search .................. 365/196, 365/210.14, 189.09, 189.07, 148, 236
See application file for complete search history.

(56) References Cited

U.S. PATENT DOCUMENTS

| | | | |
|---|---|---|---|
| 6,225,933 B1 | 5/2001 | Salter et al. | |
| 6,504,750 B1 | 1/2003 | Baker | |
| 6,813,208 B2 | 11/2004 | Baker | |
| 7,009,901 B2 | 3/2006 | Baker | |
| 7,133,312 B2 | 11/2006 | Sakimura et al. | |
| 7,292,471 B2 | 11/2007 | Sakimura et al. | |
| 2004/0004856 A1* | 1/2004 | Sakimura et al. | 365/158 |
| 2004/0240294 A1 | 12/2004 | Baker | |

FOREIGN PATENT DOCUMENTS

GB 2408603 A 6/2005

OTHER PUBLICATIONS

International Search Report and Written Opinion—PCT/US2010/058451—ISA/EPO—Apr. 12, 2011.

* cited by examiner

*Primary Examiner* — Thong Q Le
(74) *Attorney, Agent, or Firm* — Sam Talpalatsky; Nicholas J. Pauley; Jonathan T. Velasco

(57) ABSTRACT

A method of sensing a data value stored at a resistance based memory is disclosed. The method includes receiving a data signal from a data cell. The data cell includes a resistance based memory element. A reference signal is received from a reference circuit. The reference circuit includes a resistance based memory element. The data signal is converted to a data output signal having a first frequency. The reference signal is converted to a reference output signal having a second frequency. A first output signal is generated when the first frequency exceeds the second frequency. A second output signal is generated when the second frequency exceeds the first frequency.

54 Claims, 7 Drawing Sheets

RESISTANCE BASED MEMORY CIRCUIT WITH DIGITAL SENSING

I. FIELD

The present disclosure is generally related to a resistance based memory circuit with digital sensing.

II. DESCRIPTION OF RELATED ART

Advances in technology have resulted in smaller and more powerful computing devices. For example, there currently exist a variety of portable personal computing devices that are small, light weight, and easily carried by users, such as personal digital assistants (PDAs), wireless telephones, and paging devices. Portable wireless telephones, such as cellular telephones and internet protocol (IP) telephones, can communicate voice and data packets over wireless networks. Further, many such wireless telephones include other types of devices that are incorporated therein. For example, a wireless telephone may also include a digital still camera, a digital video camera, a digital recorder, and an audio file player. Such wireless telephones can execute instructions of software applications, such as a web browser application, to access the Internet. Therefore, wireless telephones can include significant computing capabilities.

The aforementioned portable personal computing devices include memory for storing data related to the use and operation of the particular device. Resistance based memories, such as Magnetic Random Access Memory (MRAM), provide high density, high speed, long term non-volatile data storage.

III. SUMMARY

Embodiments of the present disclosure provide an apparatus and method of sensing a data value stored at a resistance based memory. A sense amplifier circuit is configured to receive analog values from a data cell and a reference cell of a memory array and to generate corresponding reference outputs having a respective frequency. A comparison circuit receives the reference outputs and generates an output corresponding to the data value stored at the resistance based memory.

In a particular embodiment, a method of sensing a data value stored at a resistance based memory is disclosed. The method includes receiving a data signal from a data cell including a resistance based memory element. The method further includes receiving a reference signal from a reference circuit including a resistance based memory element. The data signal is converted to a data output signal having a first frequency, and the reference signal is converted to a reference output signal having a second frequency. A first output signal is generated when the first frequency exceeds the second frequency, and a second output signal is generated when the second frequency exceeds the first frequency.

In another particular embodiment, a method of validating a state of a resistance based memory is disclosed. The method includes receiving a first reference signal indicative of a first state of a first reference circuit that includes a resistance based memory element. The first reference signal is converted to a first reference output signal having a first frequency. The first reference output signal is compared to a first threshold value. A fault condition is stored in a memory based on the first threshold value comparison.

In another particular embodiment, an apparatus is disclosed that includes a memory comprising a data cell including a first resistance based memory element. The data cell is configured to generate a data signal. The memory also includes a reference cell including a second resistance based memory element. The reference cell is configured to generate a reference signal. An oscillator is coupled to receive the data signal and coupled to receive the reference signal. The oscillator is configured to generate a data output signal having a first frequency and to generate a reference output signal having a second frequency. A comparator is coupled to receive the data output signal and coupled to receive the reference output signal. The comparator is configured to generate a first output signal when the first frequency exceeds the second frequency and is configured to generate a second output signal when the second frequency exceeds the first frequency.

In another particular embodiment, an apparatus is disclosed. The apparatus includes a memory including means for receiving a data signal from a data cell including a resistance based memory element, and means for receiving a reference signal from a reference circuit including a resistance based memory element. The apparatus further includes means for converting the data signal to a data output signal having a first frequency, and means for converting the reference signal to a reference output signal having a second frequency. The apparatus further includes means for generating a first output signal when the first frequency exceeds the second frequency and for generating a second output signal when the second frequency exceeds the first frequency.

IV. BRIEF DESCRIPTION OF THE DRAWINGS

V. DETAILED DESCRIPTION

Figure 1:
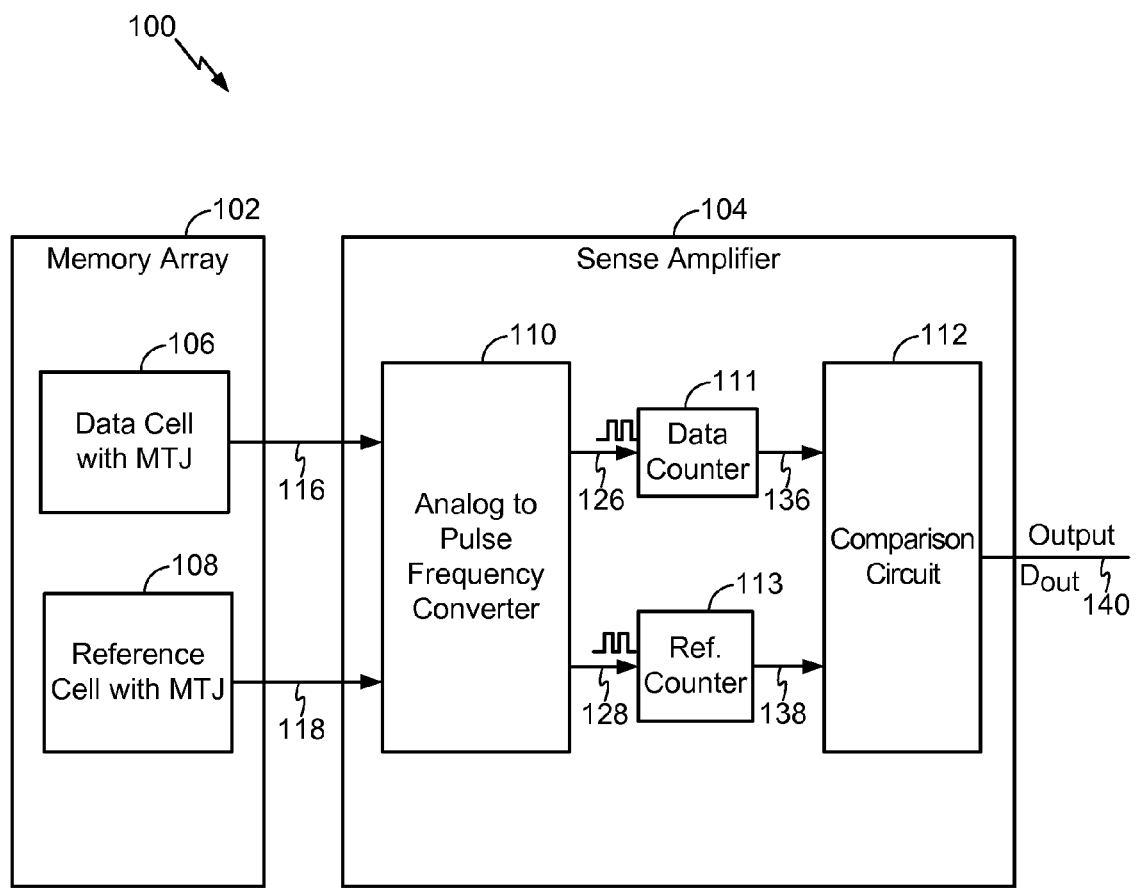
FIG. 1 is a block diagram of an illustrative embodiment of a system including a resistance based memory circuit with digital sensing and reference cell validation.

Referring to FIG. 1, a particular illustrative embodiment of a resistance based memory with digital sensing to validate a reference cell is depicted and generally designated 100. The resistance based memory 100 includes a memory array 102 and a sense amplifier circuit 104. The memory array 102 includes a data cell 106 and a reference cell 108. The sense amplifier circuit 104 includes an analog to pulse frequency converter circuit 110, a data counter circuit 111, a reference counter circuit 113, and a comparison circuit 112. The memory array 102 is coupled to the sense amplifier circuit 104. The analog to pulse frequency converter circuit 110 has a first input coupled to the data cell 106 and a second input coupled to the reference cell 108. Each of the data counter circuit 111 and the reference counter circuit 113 has an input coupled to the analog to pulse frequency converter circuit 110. In a particular embodiment, the memory array 102 is a resistance based memory such as a magnetoresistive random access memory (MRAM), a phase-change random access memory (PRAM), or a spin torque transfer MRAM (STT-MRAM). The data cell 106 and the reference cell 108 each include a resistance based memory element such as a magnetic tunnel junction (MTJ) device. In a particular embodiment, the analog to pulse frequency converter circuit 110 includes a voltage controlled oscillator (VCO) or a current starved oscillator (CSO).

During operation, the analog to pulse frequency converter circuit 110 receives an analog data signal 116 from the data cell 106 and receives an analog reference signal 118 from the reference cell 108. The analog to pulse frequency converter circuit 110 converts the data signal 116 to a data out signal 126 having a first frequency and converts the reference signal 118 to a reference out signal 128 having a second frequency. The data counter circuit 111 receives the data out signal 126 and counts a number of frequency pulses within a time window. The reference counter circuit 113 receives the reference out signal 128 and counts a number of frequency pulses within the time window. The comparison circuit 112 receives a data out signal count 136 and a reference out signal count 138, compares the data out signal count 136 to the reference out signal count 138, and generates an output Dout 140. The output Dout 140 corresponds to a data value or logic state (e.g., a zero (0) or a one (1)) of the data cell 106. For example, when the first frequency exceeds the second frequency, a first output signal is generated, and when the second frequency exceeds the first frequency, a second output signal is generated. In a particular embodiment, when the data value of the data cell 106 is a zero (0), the data out signal count 136 may be higher than the reference out signal count 138, and when the data value of the data cell 106 is a one (1), the data out signal count 136 may be lower than the reference out signal count 138.

By using digital sensing, an improved ability to reliably sense a resistance value of a resistive memory cell may improve performance of the memory device, and may reduce or obviate the role of a voltage sense amplifier. Eliminating the voltage sense amplifier may reduce the area of the memory and reduce power consumption. In addition, a digital sensing scheme may be more tolerant to process, voltage, and temperature variation.

Figure 2:
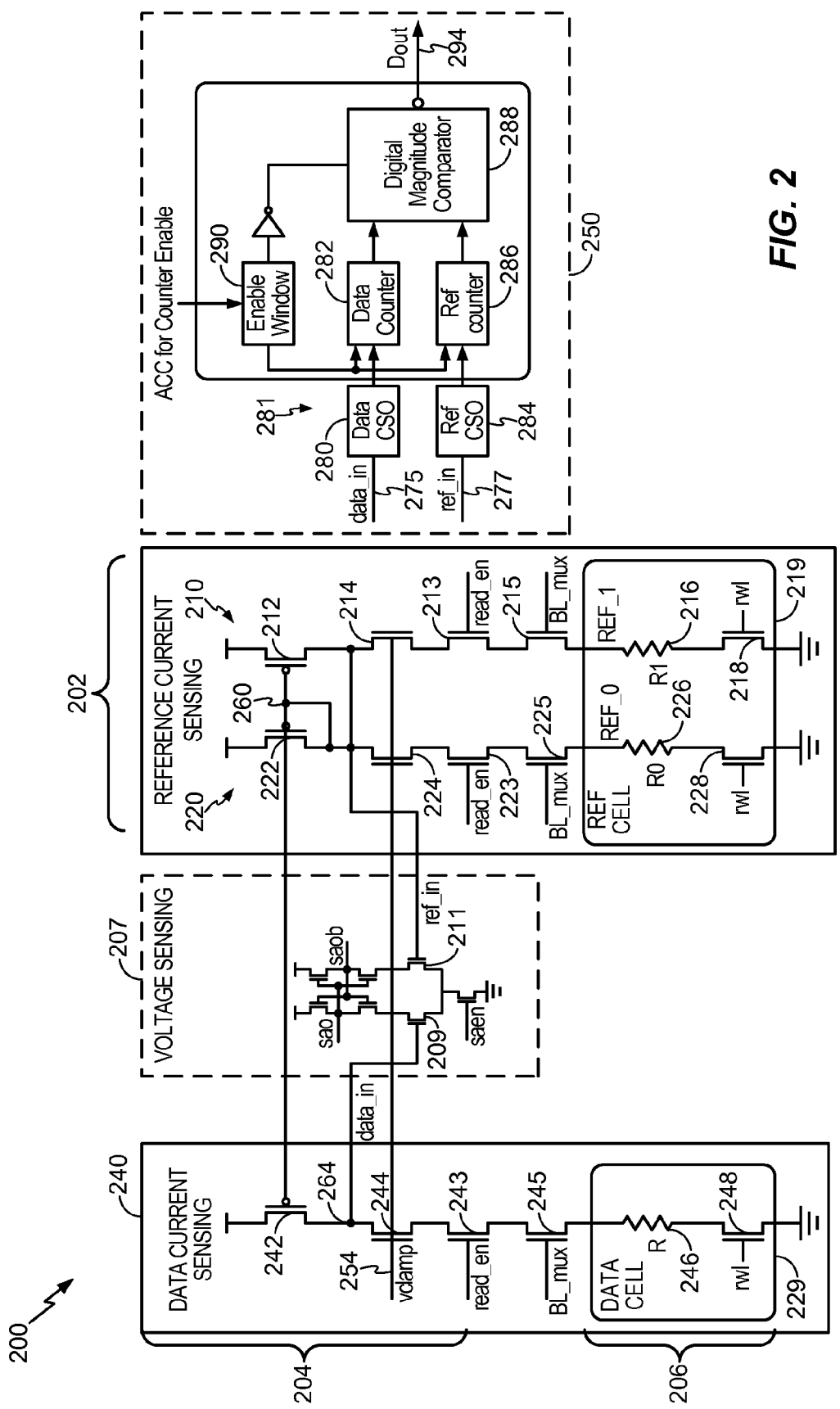
FIG. 2 is a circuit diagram of a first illustrative embodiment of a resistance based memory circuit including digital sensing.

Referring to FIG. 2, a particular illustrative embodiment of a resistance based memory is depicted and generally designated 200. The resistance based memory 200 includes a reference circuit 202 having a first reference path 210 and a second reference path 220. The resistance based memory 200 also includes a data path 240. The reference paths 210, 220 and the data path 240 are generally designated as having a first sense amplifier portion 204 that provides load elements to a memory cell portion 206 to generate an output signal for comparison at a second sense amplifier portion 207. In a particular embodiment, the resistance based memory 200 is a magnetoresistive random access memory (MRAM), a phase-change random access memory (PRAM), or a spin torque transfer MRAM (STT-MRAM).

The first reference path 210 includes a load device, such as a p-channel metal oxide semiconductor (PMOS) field effect transistor load 212. The PMOS load 212 is coupled to a first reference node 260, which in turn is coupled to a clamp transistor 214. A read enable transistor 213 is coupled to the clamp transistor 214. A bit line mux transistor 215 is coupled to the read enable transistor 213. A resistance R1 216 corresponding to a logic "one" state of a resistance based memory element is coupled to the bit line mux transistor 215. A resistance based memory element is a device having a first resistance corresponding to a logic "one" value and a second resistance corresponding to a logic "zero" value, such as a magnetic tunnel junction (MTJ) device or a PRAM memory cell as illustrative, non-limiting examples. An access transistor 218 is coupled to the resistance R1 216.

The second reference path 220 includes a load device, such as a PMOS load 222. The PMOS load 222 is coupled to the first reference node 260, which in turn is coupled to a clamp transistor 224. A read enable transistor 223 is coupled to the clamp transistor 224. A bit line mux transistor 225 is coupled to the read enable transistor 223. A resistance R0 226 corresponding to a logic "zero" state of a resistance based memory element is coupled to the bit line mux transistor 225. An access transistor 228 is coupled to the resistance R0 226. A reference cell 219 includes the resistance R1 216, the resistance R0 226, the access transistor 218 of the first reference path 210, and the access transistor 228 of the second reference path 220.

The data path 240 includes a load device, such as a PMOS load 242. The PMOS load 242 is coupled to a second reference node 264, which in turn is coupled to a clamp transistor 244. A read enable transistor 243 is coupled to the clamp transistor 244. A bit line mux transistor 245 is coupled to the read enable transistor 243. A resistance R 246 corresponding to a logic state of a resistance based memory element is coupled to the bit line mux transistor 245. An access transistor 248 is coupled to the resistance R 246. A data cell 229 includes the resistance R 246 and the access transistor 248 of the data path 240.

Generally, corresponding components of each of the paths 210, 220, 240 may have similar configurations and may operate in a substantially similar manner. Each of the clamp transistors 214, 224, and 244 functions to limit current and voltage through the respective paths 210, 220, and 240 based on a signal Vclamp 254. The signal Vclamp 254 represents a common gate voltage that enables the clamp transistors 214, 224, and 244 to function as clamping transistors. Each of the access transistors 218, 228, and 248 selectively allows current flow through the respective paths 210, 220, and 240 based on a common signal $V_{WL}$ that represents a common gate voltage to the access transistors 218, 228, and 248. Each of the PMOS load devices 212, 222, and 242 has a gate terminal that is coupled to the first reference node 260 such that a gate voltage equals a voltage Vref at the first reference node 260.

In a traditional differential voltage sensing scheme, the second sense amplifier portion 207 is a voltage sense amplifier and includes a data transistor 209 that is coupled to receive a data signal data_in corresponding to a voltage at the second reference node 264. The second sense amplifier portion 207 also includes a reference transistor 211 that is also coupled to receive a reference signal ref_in corresponding to a voltage at the first reference node 260. The data signal data_in is compared to the reference signal ref_in based on respective voltage values to determine a state of the reference cell (e.g., differential voltage sensing). The second sense amplifier portion 207 is configured to generate an output (not shown) in response to the comparison of the data signal data_in and the reference signal ref_in.

In a particular embodiment, the voltage sense amplifier 207 is replaced by a digital sense amplifier circuit 250. The digital sense amplifier circuit 250 includes an analog to pulse frequency converter circuit 281. In a particular embodiment, the analog to pulse frequency converter circuit 281 includes a data current starved oscillator circuit 280 and a reference current starved oscillator circuit 284. The digital sense amplifier circuit 250 includes a data counter circuit 282, a reference counter circuit 286, and a comparison circuit 288. In an illustrative embodiment, the digital sense amplifier circuit 250 is the sense amplifier 104 of FIG. 1.

The current starved oscillator circuit 280 is coupled to the data cell 229 and receives a data signal (data_in) 275 corresponding to a voltage at the second reference node 264. The reference current starved oscillator circuit 284 is coupled to the reference cell 219 and receives a reference signal (ref_in) 277 corresponding to a voltage at the first reference node 260. The digital sense amplifier circuit 250 is configured to generate an output Dout 294 in response to a comparison of the data signal (data_in) 275 and the reference signal (ref_in) 277.

During operation, the data current starved oscillator circuit 280 receives the data_in signal from the data cell 229, and the reference current starved oscillator circuit 284 receives the ref_in signal from the reference cell 219. The data current starved oscillator circuit 280 converts the data signal (data_in) 275 to a data out signal having a first frequency. The reference current starved oscillator 284 converts the reference signal (ref_in) 277 to a reference out signal having a second frequency. The data counter circuit 282 receives the data out signal, counts a number of frequency pulses within a time window controlled by an enable window circuit 290, and outputs a data out signal count. The reference counter circuit 286 receives the reference out signal, counts a number of frequency pulses within the time window controlled by an enable window circuit 290, and outputs a reference out signal count. The comparison circuit 288 receives the data out signal count and the reference out signal count, compares the data out signal count to the reference out signal count, and generates the output Dout 294. The output Dout 294 corresponds to a data value or logic state (e.g., a zero (0) or a one (1)) of the data cell 229. For example, when the first frequency exceeds the second frequency, a first output signal is generated and when the second frequency exceeds the first frequency, a second output signal is generated. In a particular embodiment, when the data value of the reference cell is a zero (0), the data out signal count may be higher than the reference out signal count, and when the data value of the reference cell is a one (1), the data out signal count may be lower than the reference out signal count.

By converting the MTJ resistance in the data cell 229 and in the reference cell 219 to a respective frequency, counting the respective frequencies within a time window, and comparing a data count with respect to a reference count to set an output of the second sense amplifier, a voltage sense amplifier such as the voltage sense amplifier 207 may be eliminated. Eliminating the voltage sense amplifier may reduce the area of the memory and reduce power consumption. In addition, a digital sensing scheme may be more tolerant to process, voltage, and temperature variation. By using digital sensing, the ability to reliably sense a resistance value of a resistive memory cell may improve performance of the memory device.

Figure 3:
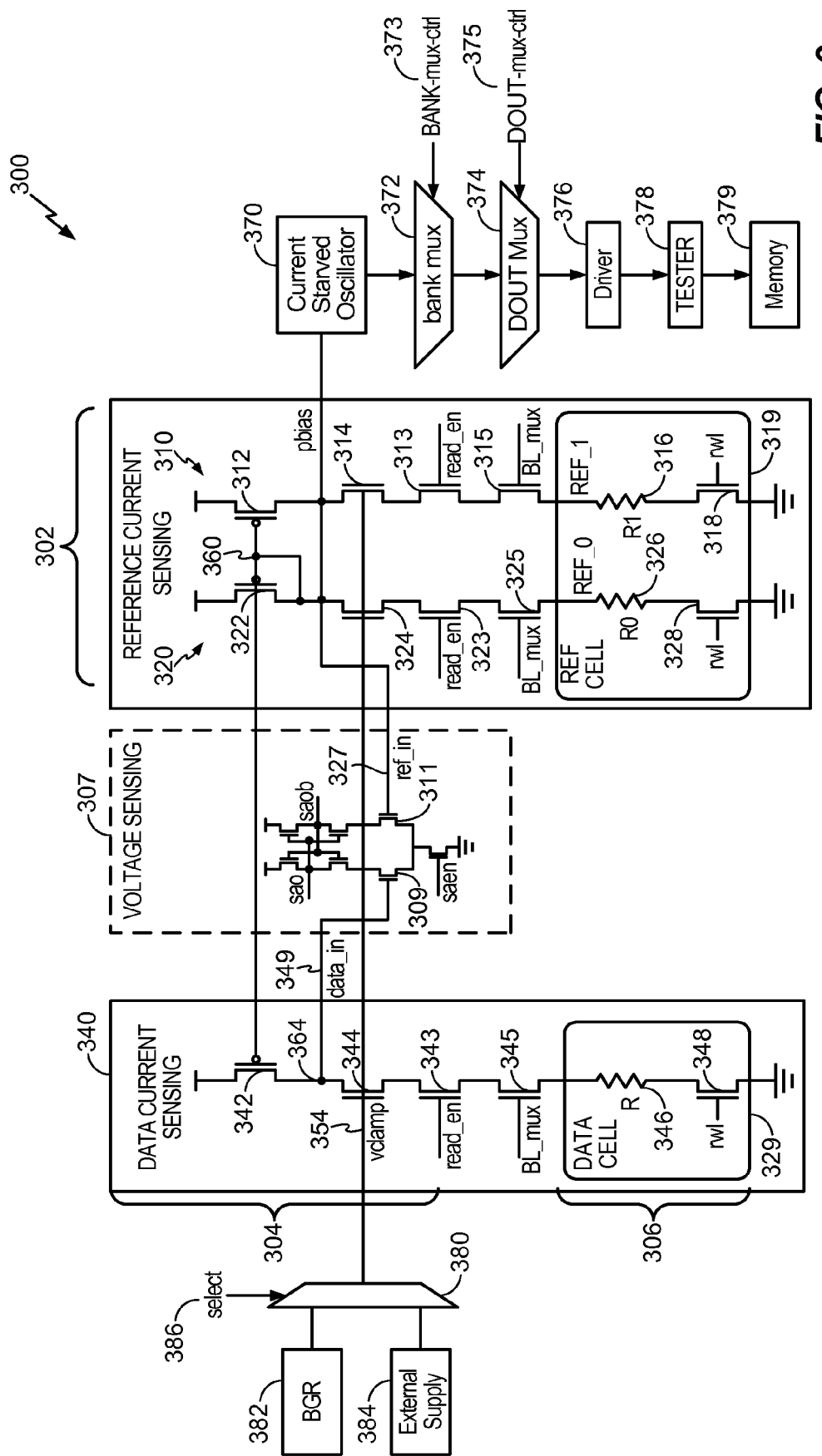
FIG. 3 is a circuit diagram of a second illustrative embodiment of a resistance based memory circuit including digital sensing.

Referring to FIG. 3, a particular illustrative embodiment of a resistance based memory including reference cell validation circuitry is depicted and generally designated 300. The resistance based memory 300 includes a reference circuit 302 having a first reference path 310 and a second reference path 320. The resistance based memory 300 also includes a data path 340. The reference paths 310, 320 and the data path 340 are generally designated as having a first sense amplifier portion 304 that provides load elements to a memory cell portion 306 to generate an output signal for comparison at a second sense amplifier portion 307.

The first reference path 310 includes a load device, such as a PMOS load 312.

The PMOS load 312 is coupled to a first reference node 360, which in turn is coupled to a clamp transistor 314. A read enable transistor 313 is coupled to the clamp transistor 314. A bit line mux transistor 315 is coupled to the read enable transistor 313. A resistance R1 316 corresponding to a logic "one" state of a resistance based memory element is coupled to the bit line mux transistor 315. An access transistor 318 is coupled to the resistance R1 316.

The second reference path 320 includes a load device, such as a PMOS load 322. The PMOS load 322 is coupled to the first reference node 360, which in turn is coupled to a clamp transistor 324. A read enable transistor 323 is coupled to the clamp transistor 324. A bit line mux transistor 325 is coupled to the read enable transistor 323. A resistance R0 326 corresponding to a logic "zero" state of a resistance based memory element is coupled to the bit line mux transistor 325. An access transistor 328 is coupled to the resistance R0 326. A reference cell 319 includes the resistance R1 316, the resistance R0 326, the access transistor 318 of the first reference path 310, and the access transistor 328 of the second reference path 320.

An oscillator 370 is coupled to the first reference node 360. In a particular embodiment, the oscillator 370 may be a current starved oscillator or a voltage controlled oscillator. A first programmable selection circuit, such as a first multiplexer 372, has a first input coupled to the oscillator 370 and a second input coupled to receive a control signal 373. In a particular embodiment, the control signal 373 is a bank mux ctrl signal. The first multiplexer 372 and the control signal 373 enable a particular bank of memory cells to be selected for testing. A second programmable selection circuit, such as a second multiplexer 374, has a first input coupled to the first multiplexer 372, and a second input coupled to receive a control signal 375. In a particular embodiment, the control signal 375 is a dout_mux_ctrl signal that enables selection of a particular current starved oscillator. A driver circuit 376 has an input coupled to the second multiplexer 374. A tester 378 has an input coupled to the driver circuit 376. A memory 379 has an input coupled to the tester 378.

The data path 340 includes a load device, such as a PMOS load 342. The PMOS load 342 is coupled to a second reference node 364, which in turn is coupled to a clamp transistor 344. A read enable transistor 343 is coupled to the clamp transistor 344. A bit line mux transistor 345 is coupled to the read enable transistor 343. A resistance R 346 corresponding to a logic state of a resistance based memory element is coupled to the bit line mux transistor 345. An access transistor 348 is coupled to the resistance R 346. A data cell 329 includes the resistance R 346 and the access transistor 348 of the data path 340.

The clamp transistor 344 has an input coupled to a programmable selection circuit, such as a multiplexer 380. The multiplexer 380 has a first input coupled to a band gap reference (BGR) circuit 382, a second input coupled to an external supply 384, and a third input coupled to receive a select signal 386.

Generally, corresponding components of each of the paths 310, 320, 340 may have similar configurations and may operate in a substantially similar manner. Each of the clamp transistors 314, 324, and 344 functions to limit current and voltage through the respective paths 310, 320, and 340 based on a signal Vclamp 354. The signal Vclamp 354 represents a common gate voltage that enables the clamp transistors 314, 324, and 344 to function as clamping transistors. Each of the access transistors 318, 328, and 348 selectively allows current flow through the respective paths 310, 320, and 340 based on a common signal $V_{WL}$ that represents a common gate voltage to the access transistors 318, 328, and 348. Each of the PMOS load devices 312, 322, and 342 has a gate terminal that is coupled to the first reference node 360 such that a gate voltage equals a voltage Vref at the first reference node 360.

The second sense amplifier portion 307 includes a data transistor 309 that is coupled to receive a data signal (data_in) 349 corresponding to a voltage at the second reference node 364. The second sense amplifier portion 307 also includes a reference transistor 311 coupled to receive a reference signal (ref_in) 327 corresponding to a voltage at the first reference node 360. The second sense amplifier portion 307 is configured to generate an output (not shown) in response to a comparison of the data signal (data_in) 349 and the reference signal (ref_in) 327.

During operation, a particular reference cell at a particular bank of memory cells may be checked or validated to determine whether one or both of the memory elements at the reference cell are indeed programmed to a zero (0) or a one (1). In a particular embodiment, an oscillator such as the oscillator 370 may be added per bank of memory cells. In a particular embodiment, the oscillator 370 may be a current starved oscillator. The multiplexer 380 receives an input from the BGR circuit 382, receives an input from the external supply 384, and receives the select signal 386. The external supply 384 enables a user to override the Vclamp 354, such that each reference cell portion REF_0 and REF_1 of the reference cell 319 may be individually selected. An analog output (pbias) 331 of the reference cell 319 is received by the oscillator 370 and is converted to pulses having a pulse frequency. The pulses may be counted during a time window and may be measured in the tester 378 to determine a state of the resistance based memory element in the reference cell 319 by comparing the number of pulses counted within the time window to a threshold value. In a particular embodiment, the tester 378 may include histogram information of oscillator frequencies for a pbias value of zero (0), for a pbias value of one (1), and for an average pbias value.

For example, a zero (0) may be written to the reference cell 319 via the BGR circuit 382, the external supply 384, and the select signal 386. The reference cell 319 may output a first reference signal indicative of the zero (0) state of the reference cell 319. The first reference signal may be converted by the oscillator 370 to a first reference output signal having a first frequency. The first reference output signal may be compared to a first threshold value at the tester 378. In a particular embodiment, the first threshold value at the tester 378 is based on or includes histogram information of oscillator frequencies for a pbias value of zero (0). A fault condition may be stored in the memory 379 based on the first threshold comparison. For example, when the first threshold value is not satisfied, the reference cell 319 may be a bad cell that is not used for memory operations or that may be corrected via a debug operation.

The example above may be repeated with a one (1) written to the reference cell 319. The reference cell 319 may output a second reference signal indicative of the one (1) state of the reference cell 319. The second reference signal may be converted by the oscillator 370 to a second reference output signal having a second frequency. The second reference output signal may be compared to a second threshold value at the tester 378. In a particular embodiment, the second threshold value at the tester 378 is based on or includes histogram information of oscillator frequencies for a pbias value of one (1). A fault condition may be stored in the memory 379 based on the second threshold comparison, such that when the second threshold value is not satisfied, the reference cell 319 may be a bad cell that is not used for memory operations or that may be corrected via a debug operation.

By including reference cell validation circuitry such as the multiplexers 380, 372, and 374, the current starved oscillator 370, and the tester 378, the programming of each reference cell 319 may be more easily validated to enable accurate sensing in an MRAM.

Figure 4:
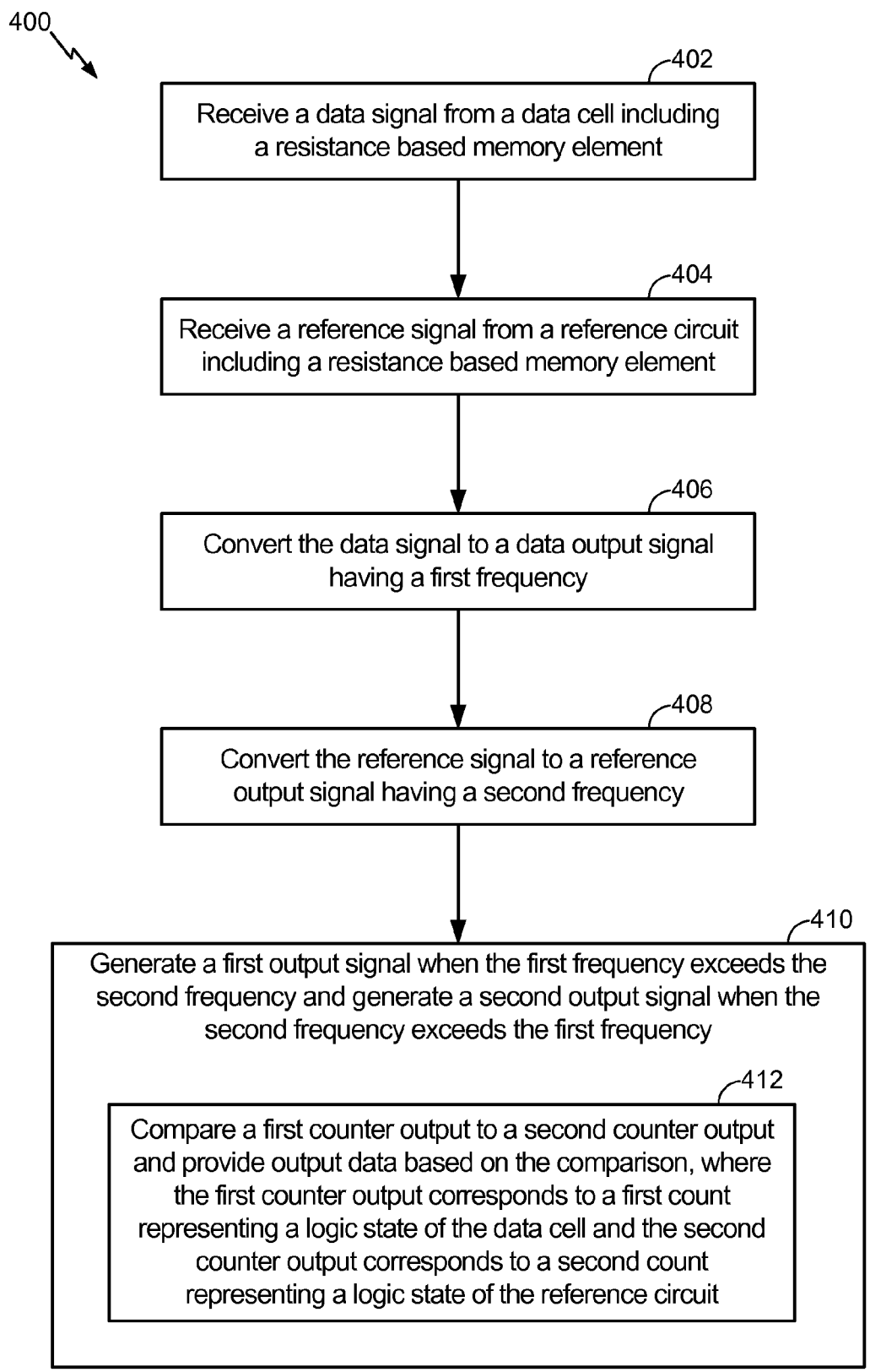
FIG. 4 is a flow diagram of a first illustrative embodiment of a method of sensing a data value stored at a resistance based memory circuit.

Referring to FIG. 4, a flow diagram of a first illustrative embodiment of a method of sensing a data value stored at a resistance based memory circuit is depicted and generally designated 400. The method 400 may be performed by components of the system 100 of FIG. 1, by components of the system 200 of FIG. 2, by other resistance based memory data sensing systems or devices, or any combination thereof.

A data signal from a data cell including a resistance based memory element is received, at 402. A reference signal from a reference circuit including a resistance based memory element is received, at 404. In a particular embodiment, the data cell is the data cell 106 of FIG. 1 or the data cell 229 of FIG. 2, and the reference circuit is the reference cell 108 of FIG. 1 or the reference cell 219 of FIG. 2. The data signal is converted to a data output signal having a first frequency, at 406. For example, converting the data signal to the data output signal may include converting the data signal via one of a voltage controlled oscillator and a current starved oscillator. In a particular embodiment, the data signal is the data signal 116 of FIG. 1 or the data signal 275 of FIG. 2. In a particular embodiment, the data output signal is the data out signal 126 of FIG. 1.

The reference signal is converted to a reference output signal having a second frequency, at 408. In a particular embodiment, the reference signal is the reference signal 118 of FIG. 1 or the reference signal 277 of FIG. 2. In a particular embodiment, the reference output signal is the reference out signal 128 of FIG. 1. In a particular embodiment, the data signal and the reference signal are each converted from respective analog voltage values to respective digital values by the analog to pulse frequency converter 110 of FIG. 1. In a particular embodiment, the analog to pulse frequency converter 110 is a current starved oscillator or a voltage controlled oscillator. In a particular embodiment, the analog to pulse frequency converter 110 is the data current starved oscillator 280 of FIG. 2 and the reference current starved oscillator 284 of FIG. 2.

A first output signal is generated when the first frequency exceeds the second frequency, and a second output signal is generated when the second frequency exceeds the first frequency, at 410. A first counter output may be compared to a second counter output, and output data may be provided based on the comparison, at 412. For example, the first counter may be data counter 111 of FIG. 1 and the second counter may be the reference counter 113 of FIG. 1. As another example, the first counter output may be the data out signal count 136 of FIG. 1 and the second counter output may be the reference out signal count 138 of FIG. 1. The comparison of the first counter output and the second counter output may be performed by the comparison circuit 112 of FIG. 1. In a particular embodiment, the first counter output may correspond to a first count representing a logic state of the data cell and the second counter output may correspond to a second count representing a logic state of the reference circuit.

A sensing scheme that utilizes digital sensing as opposed to differential voltage sensing may be more tolerant to process, voltage, and temperature variation. By using digital sensing, the ability to reliably sense a resistance value of a resistive memory cell may improve performance of the memory device.

Figure 5:
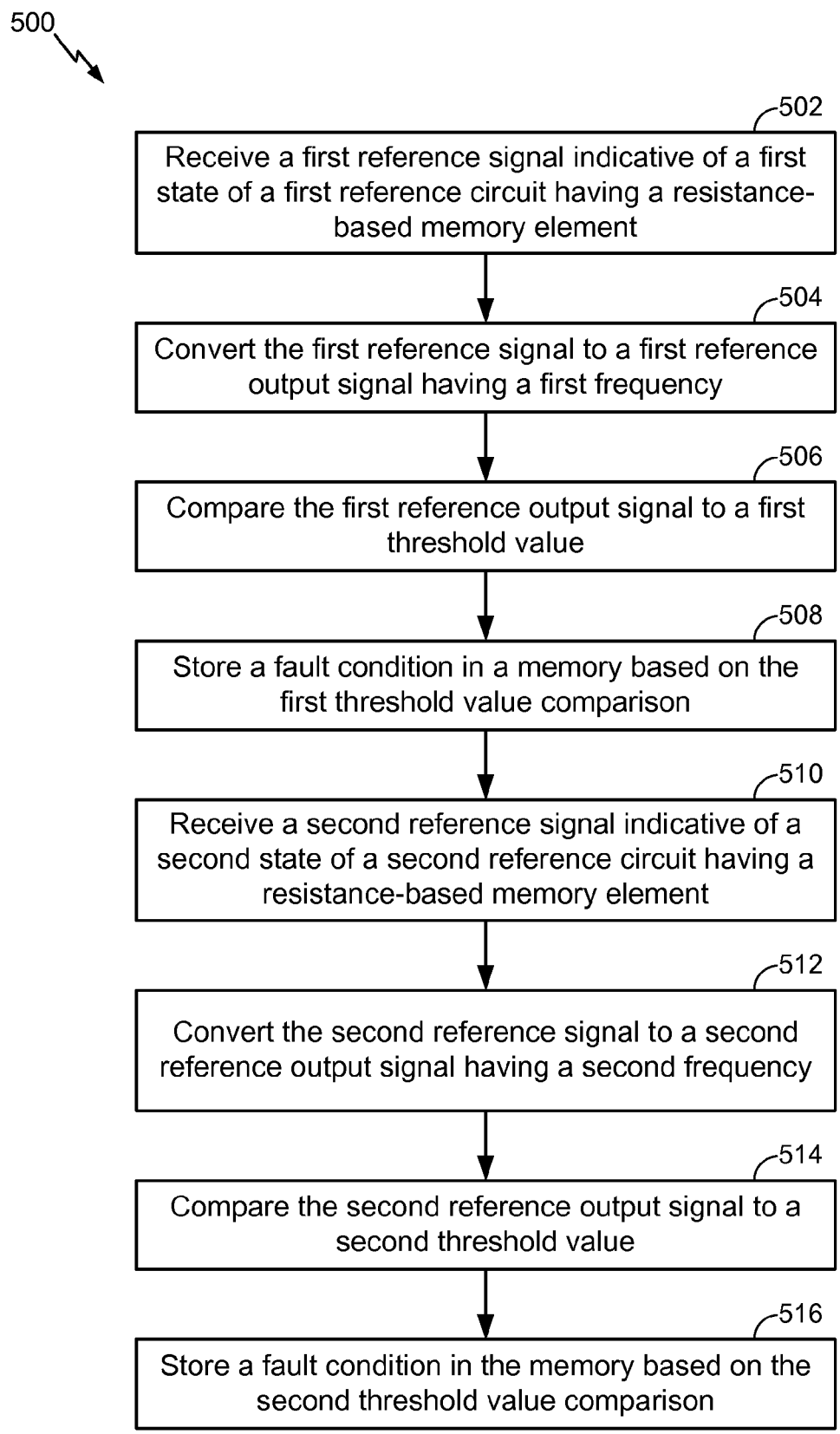
FIG. 5 is a flow diagram of a second illustrative embodiment of a method of sensing a data value stored at a resistance based memory circuit.

Referring to FIG. 5, a flow diagram of a second illustrative embodiment of a method of sensing a data value stored at a resistance based memory circuit is depicted and generally designated 500. The method 500 may be performed by components of the system 100 of FIG. 1, by components of the system 300 of FIG. 3, by other resistance based memory data sensing systems or devices, or any combination thereof.

A first reference signal indicative of a first state of a first reference circuit that includes a resistance based memory element is received, at 502. In a particular embodiment, the first reference circuit may be the reference cell 319 of FIG. 3. The first reference signal is converted to a first reference output signal having a first frequency, at 504. For example, the first reference signal may be converted to a first reference output signal having a first frequency by a current starved oscillator, such as the current starved oscillator 370 of FIG. 3. The first reference output signal is compared to a first threshold value, at 506. In a particular embodiment, the first threshold value may be determined based on a histogram of oscillator frequencies stored at the tester 378 of FIG. 3 for zero ("0") and one ("1") logic values.

A fault condition is stored in memory based on the first threshold value comparison, at 508. For example, the fault condition may be stored in the memory 379 of FIG. 3. A second reference signal indicative of a second state of a second reference circuit that includes a resistance based memory element may be received, at 510. In a particular embodiment, the second reference circuit is the reference cell 319 of FIG. 3. The second reference signal may be converted to a second reference output signal having a second frequency, at 512. In a particular embodiment, the second reference signal is converted to a second reference output signal having a second frequency by a current starved oscillator, such as the current starved oscillator 370 of FIG. 3. The second reference output signal may be compared to a second threshold value, at 514. In a particular embodiment, the second threshold value is determined based on a histogram of oscillator frequencies stored at the tester 378 of FIG. 3 for zero ("0") and one ("1") logic values. A fault condition may be stored in memory based on the second threshold value comparison, at 516. In a particular embodiment, the fault condition is stored in the memory 379 of FIG. 3. By using digital sensing, the ability to reliably sense a resistance value of a resistive memory cell and to validate the reference cell programming may improve performance of the memory device to enable sensing in an MRAM.

Figure 6:
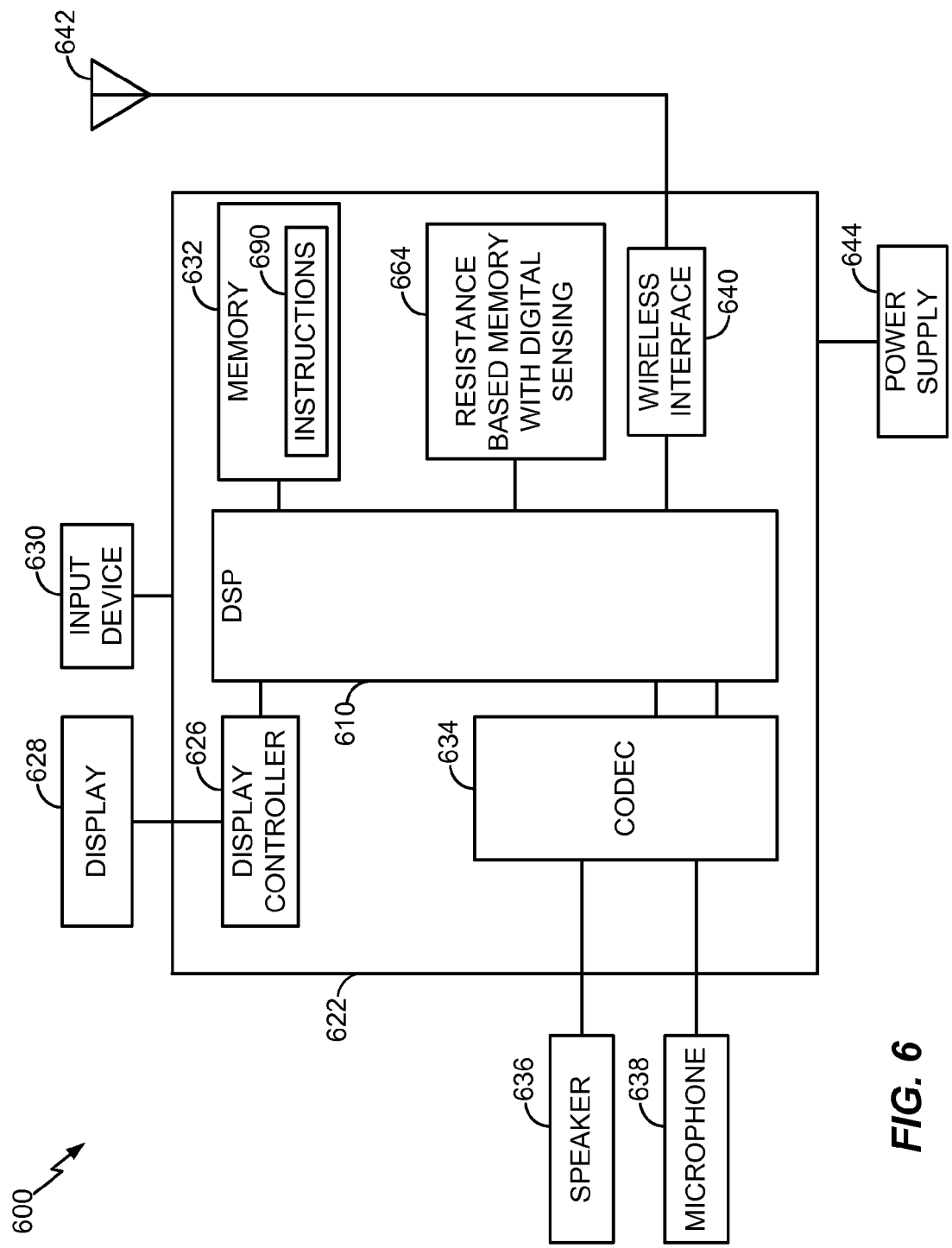
FIG. 6 is a block diagram of a particular illustrative embodiment of a wireless device including a resistance based memory circuit including digital sensing.

Referring to FIG. 6, a block diagram of a particular illustrative embodiment of an electronic device, such as a wireless phone, including a resistance based memory circuit with digital sensing and reference cell validation, as described herein, is depicted and generally designated 600. The device 600 includes a processor, such as a digital signal processor (DSP) 610, coupled to a memory 632 and also coupled to a resistance based memory circuit with digital sensing 664. In an illustrative example, the resistance based memory circuit with digital sensing 664 includes the resistance based memory 100 depicted in FIG. 1, the resistance based memory 200 depicted in FIG. 2, or the resistance based memory 300 depicted in FIG. 3. By using digital sensing, the ability to reliably sense a resistance value of a resistive memory cell may improve performance of the memory device. In a particular embodiment, the resistance based memory circuit with digital sensing 664 includes a spin torque transfer magnetoresistive random access memory (STT-MRAM) memory device.

FIG. 6 also shows a display controller 626 that is coupled to the digital signal processor 610 and to a display 628. A coder/decoder (CODEC) 634 can also be coupled to the digital signal processor 610. A speaker 636 and a microphone 638 can be coupled to the CODEC 634.

FIG. 6 also indicates that a wireless interface 640 can be coupled to the digital signal processor 610 and to a wireless antenna 642. In a particular embodiment, the DSP 610, the display controller 626, the memory 632, the CODEC 634, the wireless interface 640, and the resistance based memory circuit with digital sensing 664 are included in a system-in-package or system-on-chip 622. In a particular embodiment, an input device 630 and a power supply 644 are coupled to the on-chip system 622. Moreover, in a particular embodiment, as illustrated in FIG. 6, the display 628, the input device 630, the speaker 636, the microphone 638, the wireless antenna 642, and the power supply 644 are external to the on-chip system 622. However, each can be coupled to a component of the on-chip system 622, such as an interface or a controller.

In a particular embodiment, the DSP 610 executes processor-readable program instructions from a processor-readable medium, such as instructions 690 stored at the memory 632. For example, the memory 632 may be readable by the DSP 610 and the instructions 690 may be operational instructions that are executable by the DSP 610 to perform the method 400 of FIG. 4. For example, the instructions 690 may include instructions that are executable by the DSP 610 to receive a data signal from a data cell including a resistance based memory element of the resistance based memory circuit with digital sensing 664. For example, the data cell may be the data cell 106 of FIG. 1 or the data cell 229 of FIG. 2, and the data signal may be the data signal 116 of FIG. 1 or the data signal 275 of FIG. 2. The instructions 690 may further include instructions that are executable by the DSP 610 to receive a reference signal from a reference circuit including a resistance based memory element. In a particular embodiment, the reference circuit is the reference cell 108 of FIG. 1 or the reference cell 219 of FIG. 2, and the reference signal is the reference signal 118 of FIG. 1 or the referenced signal 277 of FIG. 2.

The instructions 690 may further include instructions that are executable by the DSP 610 to convert the data signal to a data output signal having a first frequency. The instructions 690 may also include instructions that are executable by the DSP 610 to convert the reference signal to a reference output signal having a second frequency. The instructions 690 may further include instructions that are executable by the DSP 610 to generate a first output signal when the first frequency exceeds the second frequency and to generate a second output signal when the second frequency exceeds the first frequency. In a particular embodiment, the first output signal is output Dout 140 of FIG. 1, and the second output signal is output Dout 140 of FIG. 1.

In another example, instructions 690 may be executable by the DSP 610 to perform the method 500 of FIG. 5. For example, the instructions 690 may include instructions to receive a first reference signal indicative of a first state of a first reference circuit that includes a resistance based memory element of the resistance based memory circuit with digital sensing 664. In a particular embodiment, the reference circuit is the reference cell 319 of FIG. 3. The instructions 690 may further include instructions that are executable by the DSP 610 to convert the first reference signal to a first reference output signal having a first frequency. For example, the first reference signal may be converted to a first reference output signal having a first frequency by the current starved oscillator 370 of FIG. 3. The instructions 690 may further include instructions that are executable by the DSP 610 to compare the first reference output signal to a first threshold value. For example, the first threshold value may be determined based on a histogram of oscillator frequencies stored at the tester 378 of FIG. 3. The instructions 690 may further include instructions that are executable by the DSP to store a fault condition in a memory based on the first threshold value comparison. For example, the fault condition may be stored in the memory 632.

Figure 7:
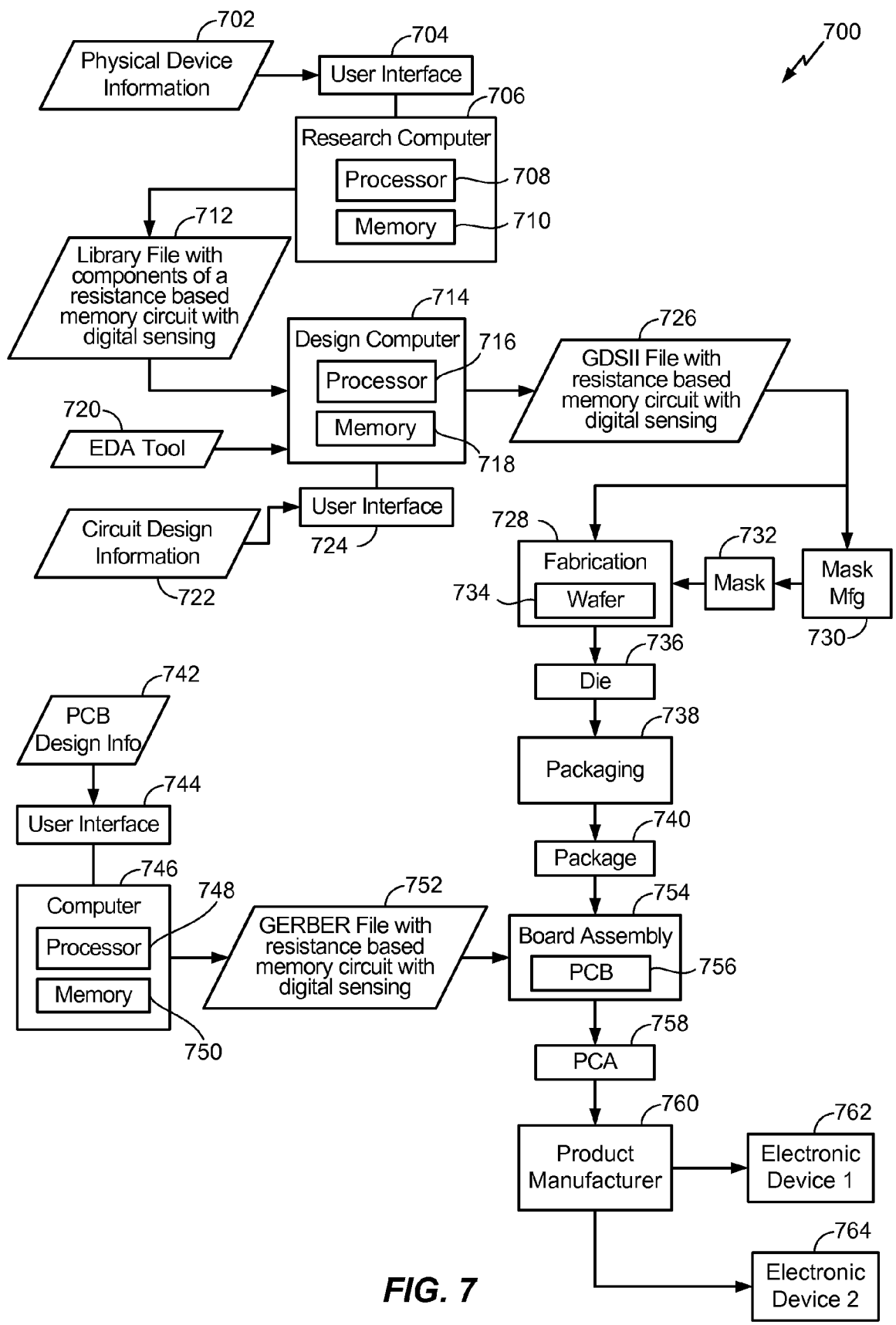
FIG. 7 is a data flow diagram of a particular illustrative embodiment of a manufacturing process to manufacture electronic devices that include a resistance based memory circuit including digital sensing.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 7 depicts a particular illustrative embodiment of an electronic device manufacturing process 700.

Physical device information 702 is received in the manufacturing process 700, such as at a research computer 706. The physical device information 702 may include design information representing at least one physical property of a semiconductor device, such as device components to be used in the system 100 of FIG. 1, the system 200 of FIG. 2, the system 300 of FIG. 3, or any combination thereof. For example the physical device information 702 may include physical parameters, material characteristics, and structure information that is entered via a user interface 704 coupled to the research computer 706. The physical device information 702 may also include histogram information of measured resistance based memory cells that may be used to determine thresholds that are applied at the tester 378. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of design files representing semiconductor devices that may be used in components of the system 100 of FIG. 1, the system 200 of FIG. 2, the system 300 of FIG. 3, or any combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including a resistance based memory including digital sensing, such as the system 100 of FIG. 1, the system 200 of FIG. 2, the system 300 of FIG. 3, or the electronic device 600 that includes the resistance based memory circuit including digital sensing 664. For example, a user of the design computer 714 may enter circuit design information 722 via a user interface 724 coupled to the design computer 714. The circuit design information 722 may include design information representing at least one physical property of a semiconductor device, such as device components to be used in the system 100 of FIG. 1, the system 200 of FIG. 2, the system 300 of FIG. 3, or the electronic device 600 that includes the resistance based memory circuit including digital sensing 664, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722 to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the device components to be used in the system 100 of FIG. 1, the system 200 of FIG. 2, the system 300 of FIG. 3, or any combination thereof, in addition to other circuits or information. To illustrate, the data file may include information corresponding to a system-on-chip (SOC) that includes the electronic device 600 of FIG. 6 and that also includes additional electronic circuits and components within the SOC.

The GDSII file 726 may be received at a fabrication process 728 to manufacture the device components to be used in the system 100 of FIG. 1, the system 200 of FIG. 2, the system 300 of FIG. 3, components of the electronic device 600 of FIG. 6, or any combination thereof, according to transformed information in the GDSII file 726. For example, a device manufacture process may include providing the GDSII file 726 to a mask manufacturer 730 to create one or more masks, such as masks to be used for photolithography processing, illustrated as a representative mask 732. The mask 732 may be used during the fabrication process to generate one or more wafers 734, which may be tested and separated into dies, such as a representative die 736. The die 736 includes a circuit including the device components to be used in the system 100 of FIG. 1, the system 200 of FIG. 2, the system 300 of FIG. 3, the electronic device 600 of FIG. 6, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board. The packaged semiconductor device may correspond to the package 740 including the device components to be used in the system 100 of FIG. 1, the system 200 of FIG. 2, the system 300 of FIG. 3, the electronic device 600 of FIG. 6, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the device components to be used in the system 100 of FIG. 1, the system 200 of FIG. 2, the system 300 of FIG. 3, the electronic device 600 of FIG. 6, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines for performing various steps of a PCB production process. The PCB 756 may be populated with electronic components including the package 740 to form a represented printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-7 may illustrate remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the device components to be used in the system 100 of FIG. 1, the system 200 of FIG. 2, the system 300 of FIG. 3, the electronic device 600 of FIG. 6, or any combination thereof, may be fabricated, processed, and incorporated into an electronic device, as described in the illustrative process 700. One or more aspects of the embodiments disclosed with respect to FIGS. 1-7 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity, or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), magnetoresistive random access memory (MRAM), phase-change random access memory (PRAM), or spin torque transfer MRAM (STT-MRAM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of sensing a data value stored at a resistance based memory, the method comprising:
   receiving a data signal from a data cell including a resistance based memory element;
   receiving a reference signal from a reference circuit including a resistance based memory element;
   converting the data signal to a data output signal having a first frequency;
   converting the reference signal to a reference output signal having a second frequency; and
   generating a first output signal when the first frequency exceeds the second frequency and generating a second output signal when the second frequency exceeds the first frequency.

2. The method of claim 1, further comprising:
   comparing a first counter output and a second counter output to produce a comparison result and providing output data based on the comparison result, wherein the first counter output corresponds to a first count representing a logic state of the data cell and the second counter output corresponds to a second count representing a logic state of the reference circuit.

3. The method of claim of claim 1, wherein converting the data signal to the data output signal includes converting via one of a voltage controlled oscillator and a current starved oscillator.

4. The method of claim 1, wherein converting the reference signal to the reference output signal includes converting via one of a voltage controlled oscillator and a current starved oscillator.

5. The method of claim 1, wherein the data cell is included in a magnetoresistive random access memory (MRAM) circuit, a phase-change random access memory (PRAM) circuit, or a spin torque transfer MRAM (STT-MRAM) circuit.

6. The method of claim 1, wherein the data cell is incorporated into a portable electronic device.

7. The method of claim 1, wherein receiving a data signal, receiving a reference signal, converting the data signal, converting the reference signal, and generating a first output signal are performed at a processor integrated into an electronic device.

8. A method of validating a state of a resistance based memory, the method comprising:
receiving a first reference signal indicative of a first state of a first reference circuit that includes a resistance based memory element;
converting the first reference signal to a first reference output signal having a first frequency;
comparing the first reference output signal to a first threshold value; and
storing a fault condition in a memory based on the first threshold value comparison.

9. The method of claim 8, further comprising:
receiving a second reference signal indicative of a second state of a second reference circuit, wherein the second state is different from the first state;
converting the second reference signal to a second reference output signal having a second frequency;
comparing the second reference output signal to a second threshold value; and
storing another fault condition in the memory based on the second threshold value comparison.

10. The method of claim 9, wherein the first threshold value corresponds to a first count representing a first known logic state stored in the first reference circuit and wherein the second threshold value corresponds to a second count representing a second known logic state stored in the second reference circuit.

11. The method of claim 8, wherein converting the first reference signal to the first reference output signal includes converting via a voltage controlled oscillator.

12. The method of claim 8, wherein converting the first reference signal to the first reference output signal includes converting via a current starved oscillator.

13. The method of claim 8, wherein the resistance based memory element is incorporated into a portable electronic device.

14. The method of claim 8, wherein receiving the first reference signal, converting the first reference signal, and comparing the first reference output signal are performed at a processor integrated into an electronic device.

15. An apparatus comprising:
a memory comprising:
a data cell including a first resistance based memory element, wherein the data cell is configured to generate a data signal;
a reference cell including a second resistance based memory element, wherein the reference cell is configured to generate a reference signal;
an oscillator coupled to receive the data signal and coupled to receive the reference signal, wherein the oscillator is configured to generate a data output signal having a first frequency and to generate a reference output signal having a second frequency; and
a comparator coupled to receive the data output signal and coupled to receive the reference output signal, wherein the comparator is configured to generate a first output signal when the first frequency exceeds the second frequency and is configured to generate a second output signal when the second frequency exceeds the first frequency.

16. The apparatus of claim 15, wherein the oscillator comprises a first oscillator circuit coupled to receive the data signal and a second oscillator circuit coupled to receive the reference signal.

17. The apparatus of claim 16, wherein each of the first oscillator circuit and the second oscillator circuit includes a voltage controlled oscillator.

18. The apparatus of claim 16, wherein each of the first oscillator circuit and the second oscillator circuit includes a current starved oscillator.

19. The apparatus of claim 16, further comprising a first counter coupled to the first oscillator circuit and a second counter coupled to the second oscillator circuit, wherein the first counter is configured to count cycles of the data output signal and wherein the second counter is configured to count cycles of the reference output signal.

20. The apparatus of claim 15, wherein the memory is integrated in at least one semiconductor die.

21. The apparatus of claim 15, further comprising a device selected from the group consisting of a set top box, a music player, a video player, an entertainment unit, a navigation device, a communications device, a personal digital assistant (PDA), a fixed location data unit, and a computer, into which the memory is integrated.

22. An apparatus comprising:
a memory comprising:
means for receiving a data signal from a data cell including a resistance based memory element;
means for receiving a reference signal from a reference circuit including a resistance based memory element;
means for converting the data signal to a data output signal having a first frequency;
means for converting the reference signal to a reference output signal having a second frequency; and
means for generating a first output signal when the first frequency exceeds the second frequency and for generating a second output signal when the second frequency exceeds the first frequency.

23. The apparatus of claim 22, wherein the memory is integrated in at least one semiconductor die.

24. The apparatus of claim 22, further comprising a device selected from the group consisting of a set top box, a music player, a video player, an entertainment unit, a navigation device, a communications device, a personal digital assistant (PDA), a fixed location data unit, and a computer, into which the memory is integrated.

25. A method comprising:
a first step for receiving a data signal from a data cell including a resistance based memory element;
a second step for receiving a reference signal from a reference circuit including a resistance based memory element;
a third step for converting the data signal to a data output signal having a first frequency;
a fourth step for converting the reference signal to a reference output signal having a second frequency; and
a fifth step for generating a first output signal when the first frequency exceeds the second frequency and generating a second output signal when the second frequency exceeds the first frequency.

26. The method of claim 25, wherein the first step, the second step, the third step, the fourth step, and the fifth step are performed by a processor integrated into an electronic device.

27. A computer readable tangible medium storing instructions executable by a computer, the instructions comprising:
instructions that are executable by the computer to receive a data signal from a data cell including a resistance based memory element;
instructions that are executable by the computer to receive a reference signal from a reference circuit including a resistance based memory element;
instructions that are executable by the computer to convert the data signal to a data output signal having a first frequency;
instructions that are executable by the computer to convert the reference signal to a reference output signal having a second frequency; and
instructions that are executable by the computer to generate a first output signal when the first frequency exceeds the second frequency and generate a second output signal when the second frequency exceeds the first frequency.

28. The computer readable tangible medium of claim 27, wherein the instructions are executable by a processor integrated in a device selected from the group consisting of a set top box, a music player, a video player, an entertainment unit, a navigation device, a communications device, a personal digital assistant (PDA), a fixed location data unit, and a computer.

29. A method comprising:
receiving design information representing at least one physical property of a semiconductor device, the semiconductor device including:
a data cell including a first resistance based memory element, wherein the data cell is configured to generate a data signal;
a reference cell including a second resistance based memory element, wherein the reference cell is configured to generate a reference signal;
an oscillator coupled to receive the data signal and coupled to receive the reference signal, wherein the oscillator is configured to generate a data output signal having a first frequency and to generate a reference output signal having a second frequency; and
a comparator coupled to receive the data output signal and coupled to receive the reference output signal, wherein the comparator is configured to generate a first output signal when the first frequency exceeds the second frequency and is configured to generate a second output signal when the second frequency exceeds the first frequency;
transforming the design information to comply with a file format; and generating a data file including the transformed design information.

30. The method of claim 29, wherein the data file includes a GDSII format.

31. A method comprising:
receiving a data file including design information corresponding to a semiconductor device; and
fabricating the semiconductor device according to the design information, wherein the semiconductor device includes:
a data cell including a first resistance based memory element, wherein the data cell is configured to generate a data signal;
a reference cell including a second resistance based memory element, wherein the reference cell is configured to generate a reference signal;
an oscillator coupled to receive the data signal and coupled to receive the reference signal, wherein the oscillator is configured to generate a data output signal having a first frequency and to generate a reference output signal having a second frequency; and
a comparator coupled to receive the data output signal and coupled to receive the reference output signal, wherein the comparator is configured to generate a first output signal when the first frequency exceeds the second frequency and is configured to generate a second output signal when the second frequency exceeds the first frequency.

32. The method of claim 31, wherein the data file includes a GDSII format.

33. A method comprising:
receiving design information including physical positioning information of a packaged semiconductor device on a circuit board, the packaged semiconductor device including a semiconductor structure comprising:
a data cell including a first resistance based memory element, wherein the data cell is configured to generate a data signal;
a reference cell including a second resistance based memory element, wherein the reference cell is configured to generate a reference signal;
an oscillator coupled to receive the data signal and coupled to receive the reference signal, wherein the oscillator is configured to generate a data output signal having a first frequency and to generate a reference output signal having a second frequency; and
a comparator coupled to receive the data output signal and coupled to receive the reference output signal, wherein the comparator is configured to generate a first output signal when the first frequency exceeds the second frequency and is configured to generate a second output signal when the second frequency exceeds the first frequency; and
transforming the design information to generate a data file.

34. The method of claim 33, wherein the data file includes a GERBER format.

35. A method comprising:
receiving a data file including design information including physical positioning information of a packaged semiconductor device on a circuit board; and
manufacturing the circuit board configured to receive the packaged semiconductor device according to the design information, wherein the packaged semiconductor device includes a semiconductor structure comprising:

a data cell including a first resistance based memory element, wherein the data cell is configured to generate a data signal;

a reference cell including a second resistance based memory element, wherein the reference cell is configured to generate a reference signal;

an oscillator coupled to receive the data signal and coupled to receive the reference signal, wherein the oscillator is configured to generate a data output signal having a first frequency and to generate a reference output signal having a second frequency; and a comparator coupled to receive the data output signal and coupled to receive the reference output signal, wherein the comparator is configured to generate a first output signal when the first frequency exceeds the second frequency and is configured to generate a second output signal when the second frequency exceeds the first frequency.

36. The method of claim 35, wherein the data file includes a GERBER format.

37. The method of claim 35, further comprising integrating the circuit board into a device selected from the group consisting of a set top box, a music player, a video player, an entertainment unit, a navigation device, a communications device, a personal digital assistant (PDA), a fixed location data unit, and a computer.

38. An apparatus comprising:
a first reference circuit including a resistance based memory element, wherein the first reference circuit is configured to generate a first reference signal indicative of a first state of the first reference circuit;
an oscillator configured to convert the first reference signal into a first reference output signal having a first frequency;
a comparator configured to compare the first reference signal and a first threshold value to produce a first comparison result; and
a memory to store a first fault condition based on the first comparison result.

39. The apparatus of claim 38, further comprising:
a second reference circuit configured to generate a second reference signal indicative of a second state of the second reference circuit, wherein the second state is different from the first state;
wherein the oscillator is to convert the second reference signal into a second reference output signal having a second frequency;
wherein the comparator is configured to compare the second reference output signal and a second threshold value to produce a second comparison result; and
wherein the memory is configured to store a second fault condition based on the second comparison result.

40. The apparatus of claim 39, wherein the first threshold value corresponds to a first count representing a first logic state stored in the first reference circuit and wherein the second threshold value corresponds to a second count representing a second logic state stored in the second reference circuit.

41. The apparatus of claim 38, wherein the oscillator includes a voltage controlled oscillator.

42. The apparatus of claim 38, wherein the oscillator includes a current starved oscillator.

43. The apparatus of claim 38, wherein the first reference circuit is incorporated into a portable electronic device.

44. The apparatus of claim 38, further comprising a device selected from the group consisting of a set top box, a music player, a video player, an entertainment unit, a navigation device, a communications device, a personal digital assistant (PDA), a fixed location data unit, and a computer, into which the first reference circuit is integrated.

45. An apparatus comprising:
means for receiving a first reference signal indicative of a first state of a first reference circuit that includes a resistance based memory element;
means for converting the first reference signal to a first reference output signal having a first frequency;
means for comparing the first reference output signal and a first threshold value to produce a first comparison result; and
means for storing a first fault condition in a memory based on the first comparison result.

46. The apparatus of claim 45, further comprising:
means for receiving a second reference signal indicative of a second state of a second reference circuit, wherein the second state is different from the first state;
means for converting the second reference signal to a second reference output signal having a second frequency;
means for comparing the second reference output signal and a second threshold value to produce a second comparison result; and
means for storing a second fault condition in the memory based on the second comparison result.

47. The apparatus of claim 46, wherein the first threshold value corresponds to a first count representing a first logic state stored in the first reference circuit and wherein the second threshold value corresponds to a second count representing a second logic state stored in the second reference circuit.

48. The method of claim 45, wherein the means for converting the first reference signal to the first reference output signal includes a voltage controlled oscillator.

49. The apparatus of claim 45, wherein the means for converting the first reference signal to the first reference output signal includes a current starved oscillator.

50. The apparatus of claim 45, wherein the resistance based memory element is incorporated into a portable electronic device.

51. The method of claim 45, wherein the means for receiving the first reference signal, the means for converting the first reference signal, and the means for comparing the first reference output signal are included in a processor integrated into an electronic device.

52. A non-transitory computer-readable medium comprising processor-executable instructions that, when executed by a processor, cause the processor to:
receive a first reference signal indicative of a first state of a first reference circuit that includes a resistance based memory element;
convert the first reference signal to a first reference output signal having a first frequency;
compare the first reference output signal and a first threshold value to produce a first comparison result; and
provide a first fault condition for storage in a memory based on the first comparison result.

53. The non-transitory computer-readable medium of claim 52, further comprising processor-executable instructions that, when executed by the processor, cause the processor to:
receive a second reference signal indicative of a second state of a second reference circuit, wherein the second state is different from the first state;
convert the second reference signal to a second reference output signal having a second frequency;

compare the second reference output signal and a second threshold value to produce a second comparison result; and store a second fault condition for storage in the memory based on the second comparison result.

54. The non-transitory computer-readable medium of claim 52, wherein the first threshold value corresponds to a first count representing a first logic state stored in the first reference circuit and wherein the second threshold value corresponds to a second count representing a second logic state stored in the second reference circuit.

* * * * *